(12) United States Patent
Huang et al.

(10) Patent No.: US 9,053,011 B2
(45) Date of Patent: Jun. 9, 2015

(54) SELECTIVE PROTECTION OF LOWER PAGE DATA DURING UPPER PAGE WRITE

(71) Applicant: SanDisk Technologies Inc., Plano, TX (US)

(72) Inventors: Jianmin Huang, San Carlos, CA (US); Abhijeet Manohar, San Jose, CA (US); Chris Nga Yee Avila, Saratoga, CA (US); Gautam Ashok Dusija, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 214 days.

(21) Appl. No.: 13/781,204

(22) Filed: Feb. 28, 2013

(65) Prior Publication Data

US 2014/0095770 A1    Apr. 3, 2014

Related U.S. Application Data

(60) Provisional application No. 61/707,208, filed on Sep. 28, 2012.

(51) Int. Cl.
*G06F 12/00* (2006.01)
*G06F 12/02* (2006.01)
*G11C 11/56* (2006.01)
*G11C 16/04* (2006.01)
*G11C 16/34* (2006.01)

(52) U.S. Cl.
CPC .... *G06F 12/0246* (2013.01); *G06F 2212/7204* (2013.01); *G06F 2212/7202* (2013.01); *G06F 2212/72* (2013.01); *G11C 11/5642* (2013.01); *G11C 16/0483* (2013.01); *G11C 16/3427* (2013.01)

(58) Field of Classification Search
CPC ............ G06F 12/0246; G06F 2212/72; G06F 2212/7202; G06F 2212/7204
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |

(Continued)

FOREIGN PATENT DOCUMENTS

WO    WO 2006120686    11/2006

OTHER PUBLICATIONS

Shibata et al., "A 19nm 112.8mm² 64Gb Multi-Level Flash Memory with 400Mb/s/pin 1.8V Toggle Mode Interface," IEEE International Solid-State Circuits Conference, 2012, pp. 422-424.

(Continued)

*Primary Examiner* — Shawn X Gu
(74) *Attorney, Agent, or Firm* — Davis Wright Tremaine LLP

(57) ABSTRACT

Lower page data that may be endangered by programming upper page data in the same memory cells is protected during upper programming using protective upper page programming schemes. High overall programming speeds are maintained by selectively using protective upper programming schemes only where endangered data is committed and may not be recoverable from another location.

20 Claims, 13 Drawing Sheets

(56) References Cited

U.S. PATENT DOCUMENTS

| | | | |
|---|---|---|---|
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,924,613 | B1 | 4/2011 | Sommer et al. |
| 2004/0268063 | A1 | 12/2004 | Lasser |
| 2006/0126394 | A1 | 6/2006 | Li |
| 2009/0067241 | A1 | 3/2009 | Gorobets et al. |
| 2009/0310408 | A1 | 12/2009 | Lee et al. |
| 2010/0246260 | A1 | 9/2010 | Kang |
| 2010/0318839 | A1 | 12/2010 | Avila et al. |

OTHER PUBLICATIONS

U.S. Application entitled "Write Abort Recovery Through Intermediate State Shifting," filed Feb. 21, 2012, 34 pages.

Technical Search Report by Examiner, Nov. 6, 2012, 11 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

Programming into four states represented by a 2-bit code

Multistate Memory

Lower Page Programming (2-bit Code)

Upper Page Programming (2-bit Code)

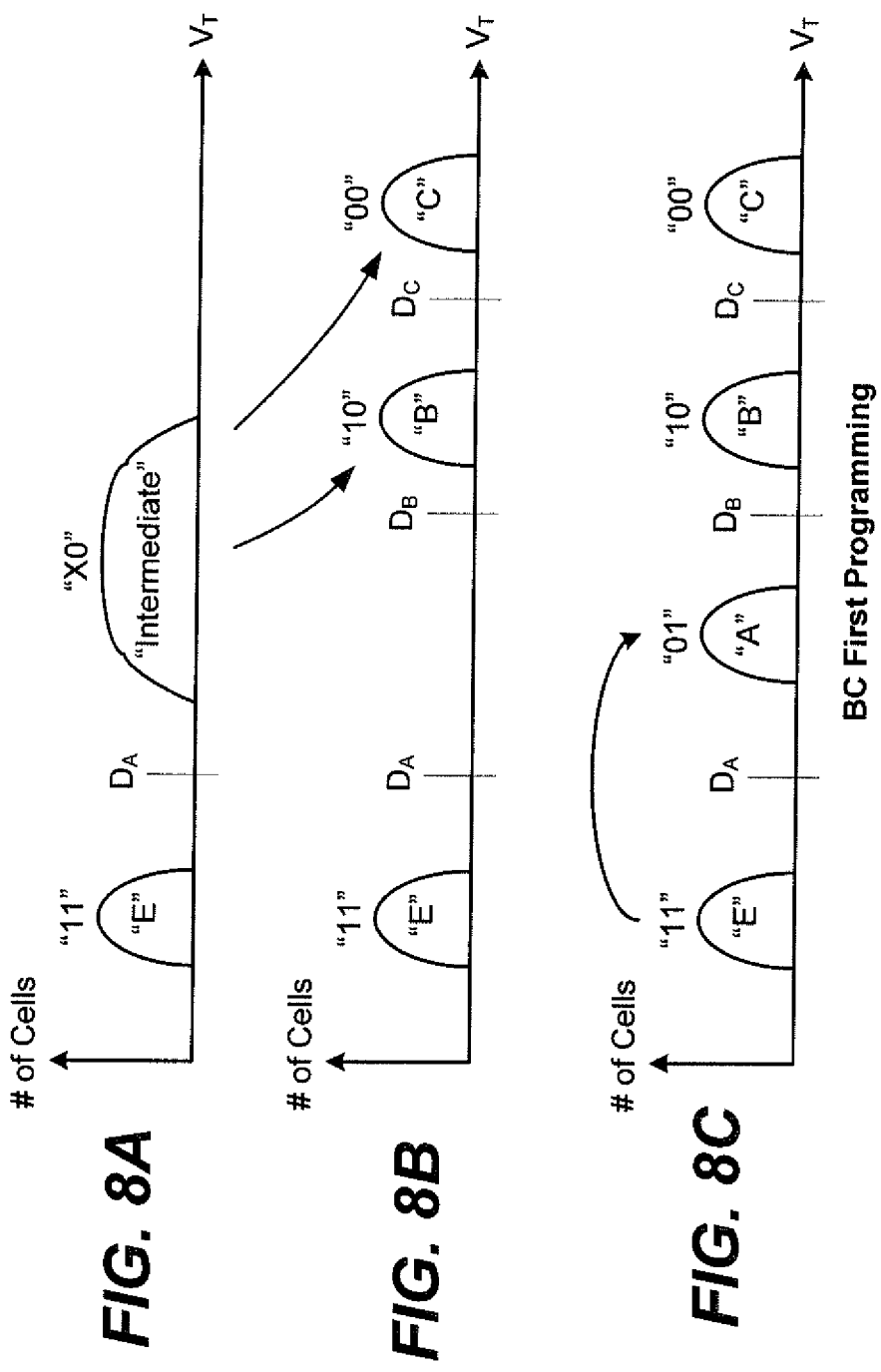

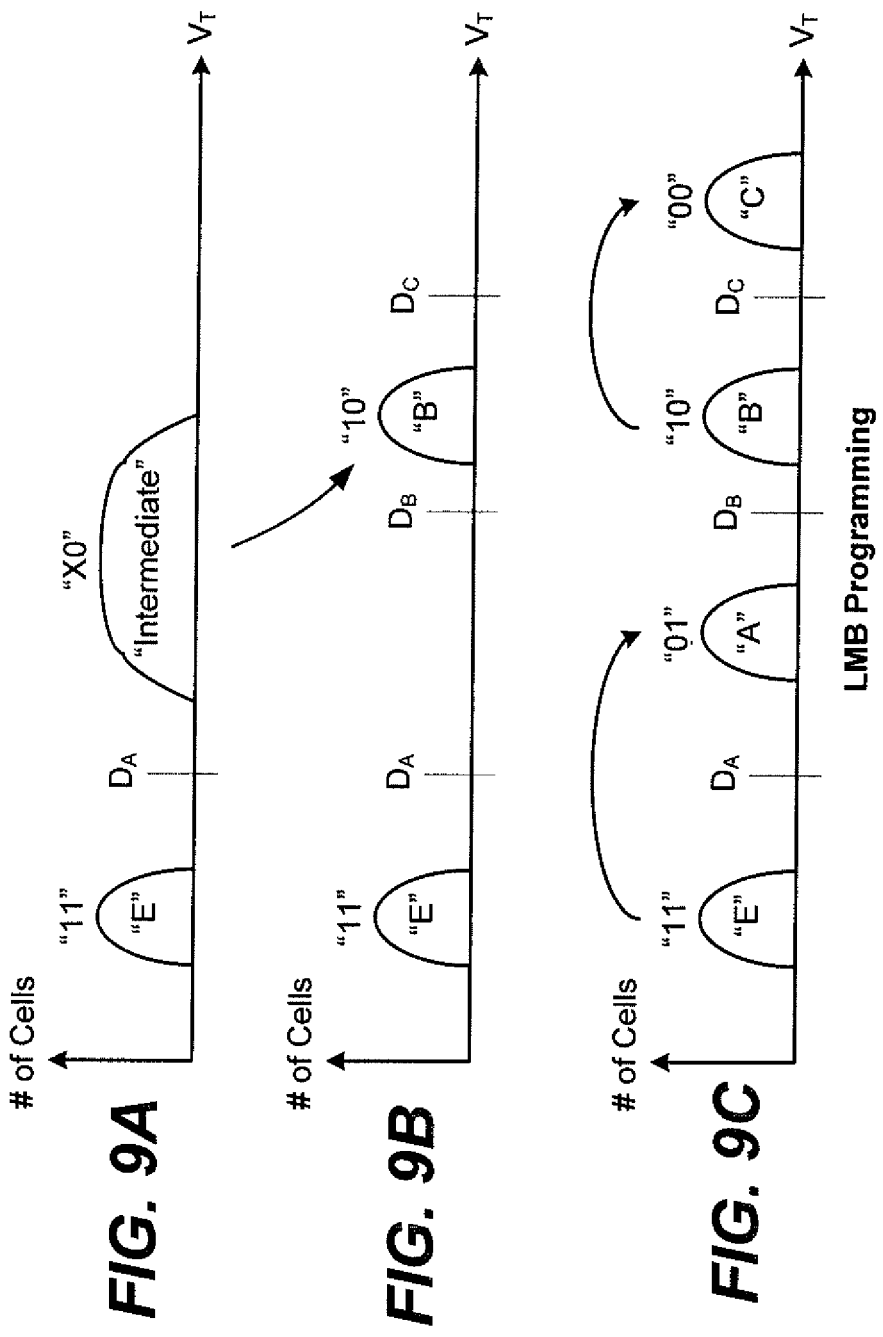

| WL | L  | U  |
|----|----|----|
| 0  | 0  | 2  |
| 1  | 1  | 4  |
| 2  | 3  | 6  |
| 3  | 5  | 8  |
| 4  | 7  | A  |
| 5  | 9  | C  |
| 6  | B  | E  |
| 7  | D  | 10 |
| 8  | F  | 12 |
| 9  | 11 | 14 |
| 10 | 13 | 16 |

FIG. 10

| WL | L      | U      |
|----|--------|--------|
| 0  | Normal | Normal |
| 1  | Normal | BCF    |
| 2  | Normal | BCF    |
| 3  | Normal | Normal |
| 4  | Normal | Normal |
| 5  | Normal | Normal |
| 6  | Normal | Normal |
| 7  | Normal | Normal |
| 8  | Normal | Normal |
| 9  | Normal | BCF    |
| 10 | Normal | Normal |
| 11 | Normal | Normal |

FIG. 11

| WL | L      | U           |
|----|--------|-------------|
| 0  | Normal | Normal      |
| 1  | Normal | BCF w/ cache|
| 2  | Normal | BCF         |
| 3  | Normal | Normal      |
| 4  | Normal | Normal      |
| 5  | Normal | Normal      |
| 6  | Normal | Normal      |
| 7  | Normal | Normal      |
| 8  | Normal | Normal      |
| 9  | Normal | BCF         |
| 10 | Normal | Normal      |
| 11 | Normal | Normal      |

FIG. 12

| Page# | Die 0 | Die 1 | Die 2 | Die 3 |
|---|---|---|---|---|
| 0 | Normal | Normal | Normal | Normal |
| 1 | Normal | Normal | Normal | Normal |
| 2 | Normal | Normal | Normal | Normal |
| 3 | Normal | Normal | Normal | Normal |
| 4 | BCF | BCF | BCF | BCF |
| 5 | Normal | Normal | Normal | Normal |
| 6 | BCF | BCF | BCF | BCF |
| 7 | Normal | Normal | Normal | Normal |
| 8 | Normal | Normal | Normal | Normal |
| 9 | Normal | Normal | Normal | Normal |
| A | Normal | Normal | Normal | Normal |
| B | Normal | Normal | Normal | Normal |
| C | Normal | Normal | Normal | Normal |
| D | Normal | Normal | Normal | Normal |
| E | Normal | Normal | Normal | Normal |
| F | Normal | Normal | Normal | Normal |
| 10 | Normal | Normal | Normal | Normal |
| 11 | Normal | Normal | Normal | Normal |
| 12 | Normal | Normal | Normal | Normal |
| 13 | Normal | Normal | Normal | Normal |
| 14 | BCF | BCF | BCF | BCF |
| 15 | Normal | Normal | Normal | Normal |
| 16 | Normal | Normal | Normal | Normal |
| 17 | Normal | Normal | Normal | Normal |

*FIG. 13*

| Page# | Die 0 | Die 1 | Die 2 | Die 3 |
|---|---|---|---|---|
| 0 | Normal | Normal | Normal | Normal |
| 1 | Normal | Normal | Normal | Normal |
| 2 | Normal | Normal | Normal | Normal |
| 3 | Normal | Normal | Normal | Normal |
| 4 | Normal | *BCF* | *BCF* | *BCF* |
| 5 | Normal | Normal | Normal | Normal |
| 6 | *BCF* | *BCF* | *BCF* | *BCF* |
| 7 | Normal | Normal | Normal | Normal |
| 8 | Normal | Normal | Normal | Normal |
| 9 | Normal | Normal | Normal | Normal |
| A | Normal | Normal | Normal | Normal |
| B | Normal | Normal | Normal | Normal |
| C | Normal | Normal | Normal | Normal |
| D | Normal | Normal | Normal | Normal |
| E | Normal | Normal | Normal | Normal |
| F | Normal | Normal | Normal | Normal |
| 10 | Normal | Normal | Normal | Normal |
| 11 | Normal | Normal | Normal | Normal |
| 12 | Normal | Normal | Normal | Normal |
| 13 | Normal | Normal | Normal | Normal |
| 14 | *BCF* | *BCF* | *BCF* | *BCF* |
| 15 | Normal | Normal | Normal | Normal |
| 16 | *BCF* | *BCF\** | *BCF\** | *BCF\** |
| 17 | Normal | Normal | Normal | Normal |

*FIG. 14*

| Page# | Die 0 | | Die 1 | | Die 2 | | Die 3 | |
|---|---|---|---|---|---|---|---|---|
| 0 | Normal | Normal | Normal | Normal | Normal | Normal | Normal | Normal |
| 1 | Normal | Normal | Normal | Normal | Normal | Normal | Normal | Normal |
| 2 | Normal | Normal | Normal | Normal | Normal | Normal | Normal | Normal |
| 3 | Normal | Normal | Normal | Normal | Normal | Normal | Normal | Normal |
| 4 | Normal | Normal | Normal | _BCF_ | _BCF_ | _BCF_ | _BCF_ | _BCF_ |
| 5 | Normal | Normal | Normal | Normal | Normal | Normal | Normal | Normal |
| 6 | _BCF_ | _BCF_ | _BCF_ | _BCF_ | _BCF_ | _BCF_ | _BCF_ | _BCF_ |
| 7 | Normal | Normal | Normal | Normal | Normal | Normal | Normal | Normal |
| 8 | Normal | Normal | Normal | Normal | Normal | Normal | Normal | Normal |
| 9 | Normal | Normal | Normal | Normal | Normal | Normal | Normal | Normal |
| A | Normal | Normal | Normal | Normal | Normal | Normal | Normal | Normal |
| B | Normal | Normal | Normal | Normal | Normal | Normal | Normal | Normal |
| C | Normal | Normal | Normal | Normal | Normal | Normal | Normal | Normal |
| D | Normal | Normal | Normal | Normal | Normal | Normal | Normal | Normal |
| E | Normal | Normal | Normal | Normal | Normal | Normal | Normal | Normal |
| F | Normal | Normal | Normal | Normal | Normal | Normal | Normal | Normal |
| 10 | Normal | Normal | Normal | Normal | Normal | Normal | Normal | Normal |
| 11 | Normal | Normal | Normal | Normal | Normal | Normal | Normal | Normal |
| 12 | Normal | Normal | Normal | Normal | Normal | Normal | Normal | Normal |
| 13 | Normal | Normal | Normal | Normal | Normal | Normal | Normal | Normal |
| 14 | _BCF_ | _BCF_ | _BCF_ | _BCF_ | _BCF_ | _BCF_ | _BCF_ | _BCF_ |
| 15 | Normal | Normal | Normal | Normal | Normal | Normal | Normal | Normal |
| 16 | _BCF_ | _BCF_ | _BCF_ | _BCF*_ | _BCF*_ | _BCF*_ | _BCF*_ | _BCF*_ |
| 17 | Normal | Normal | Normal | Normal | Normal | Normal | Normal | Normal |

*FIG. 15*

SELECTIVE PROTECTION OF LOWER PAGE DATA DURING UPPER PAGE WRITE

This application claims the benefit of U.S. Provisional Patent Application No. 61/707,208, filed on Sep. 28, 2012, which is hereby incorporated by reference in its entirety.

BACKGROUND

This application relates to the operation of re-programmable non-volatile memory systems such as semiconductor flash memory that can store one or more bits per cell by writing multiple states, and more specifically, to protecting data stored in memory cells during programming of additional data in the same memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

In one common arrangement, individual cells may use two or more memory states to store one or more bits of data. Initially, a page of memory cells may be programmed with a "lower page" of data consisting of one bit per cell. Later programming may add an "upper page" of data in the same cells by writing an additional bit in each cell. More than two bits may also be successively stored in this way in some memory systems. At any given time, a memory may include physical pages with different program levels, some physical pages containing zero bits per cell, some with one bit per cell, and some with two or more bits per cell. When programming such memories it is important to know how many bits per cell a particular page contains.

SUMMARY

When upper page data is written into flash memory cells that already contain lower page data, the lower page data may transition during the upper page programming so that, in the case of a write abort, the data may be unrecoverable. Certain upper page programming schemes protect endangered lower page data by transitioning cells in such a manner that lower page data remains recoverable throughout upper page writing. These protective schemes may incur a time penalty. Selective use of protective schemes allows the advantage of being able to recover lower page data that is endangered by upper page writing while maintaining a high overall write speed.

An example of a method of programming data in a multi-level cell (MLC) flash memory array includes: prior to programming upper page data in a physical page of a memory array, determining whether lower page data stored in the physical page is committed or not committed; programming the upper page data in a first manner whenever the lower page data stored in the physical page is committed data; and programming the upper page data in a second manner whenever the lower page data stored in the physical page does not contain committed data.

The upper page data may be programmed in response to a current write command that has not completed execution, and the lower page data may be identified as committed data as a result of being received and stored in response to a prior write command that completed execution prior to the current write command. The upper page data may be programmed in response to a current write command that has not completed execution, and the lower page data may be identified as not committed as a result of being received and stored in response to the current write command. Programming in the first manner may be slower than programming in the second manner. Programming in the first manner may maintain memory cells of the physical page in conditions in which lower page data is resolvable throughout the programming of the upper page data. Programming in the second manner may transition memory cells of the physical page through intermediate conditions, and lower page data may not be resolvable while the memory cells are in the intermediate conditions. The first manner may program the upper page data in two sequential steps. A first step of the two sequential steps may program memory cells to two memory states with the two highest threshold voltage ranges and a second step of the two sequential steps may program memory cells in the erased state to a programmed state. A first step of the two sequential steps may program memory cells to only the memory state with the second highest threshold voltage range and the second step may program memory cells from the memory state with the second highest threshold voltage range to the memory state with the highest threshold voltage range and in parallel may program memory cells from the erased state to a programmed state.

An example of a method of selectively protecting lower page data in a multi-level cell memory array during programming of upper page data in the same memory cells includes: identifying data to be written in memory cells containing committed lower page data from one or more previous fully-executed write commands; programming the identified data using a protective upper page writing scheme that increases threshold voltages of memory cells containing the committed lower page data so that threshold voltages reflect the committed lower page data throughout the programming of the identified data; and programming all other upper page data using a non-protective upper page writing scheme that transitions threshold voltages of memory cells containing uncommitted lower page data through threshold voltage ranges that do not reflect the uncommitted lower page data.

The protective upper page writing scheme may be a two-step scheme and a first step may only program memory cells containing the committed lower page data to two memory states with the highest threshold voltage ranges. A subsequent second step may program memory cells from a memory state with the lowest threshold voltage range to a memory state with the next lowest threshold voltage range. The protective upper page writing scheme may be a two-step scheme and a first step may only program memory cells containing the committed lower page data to a memory state with the second highest threshold voltage range. A subsequent second step may program memory cells from the memory state with the second highest threshold voltage range to a memory state with the highest threshold voltage range and in parallel may program cells from a memory state with the lowest threshold voltage range to a memory state with the second lowest threshold voltage range. Data of a subsequent page write may be selectively cached during programming of a page of the identified data using the protective upper page writing scheme only when at least one additional page of the identified data is to be written using the protective upper page writing scheme. The memory array may extend over a plurality of planes of memory cells and data may be interleaved to the plurality of planes for programming. The memory array may extend over a plurality of dies and data may be interleaved to the plurality of dies for programming.

An example of a multi-level cell memory with lower page protection includes: a memory array that includes a plurality of physical pages of multi-level memory cells, each physical page configured to store two logical pages of data, an upper page and a lower page; and memory programming circuits that apply two different upper page programming schemes, a protective upper page programming scheme for physical pages containing committed lower page data and a non-protective upper page programming scheme for physical pages containing uncommitted lower page data. The memory array may comprise a plurality of memory dies. Each of the plurality of memory dies may comprise a plurality of planes.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIGS. 8A-8C illustrate a protective "BC first" scheme for programming upper page data in flash memory.
FIGS. 9A-9C illustrate a protective "LMB" scheme for programming upper page data in flash memory.
FIG. 10 illustrates an order in which upper and lower pages may be written.
FIG. 11 illustrates selective use of a protective programming scheme for upper pages.
FIG. 12 illustrates selective use of caching and selective use of a protective programming scheme for upper pages.
FIG. 13 shows an example of selective use of protective upper page programming in a multi-die flash memory array.
FIG. 14 shows another example of selective use of protective upper page programming in a multi-die flash memory array.
FIG. 15 shows an example of selective use of protective upper page programming in a multi-plane, multi-die flash memory array.

DETAILED DESCRIPTION

Memory System

Figure 1:
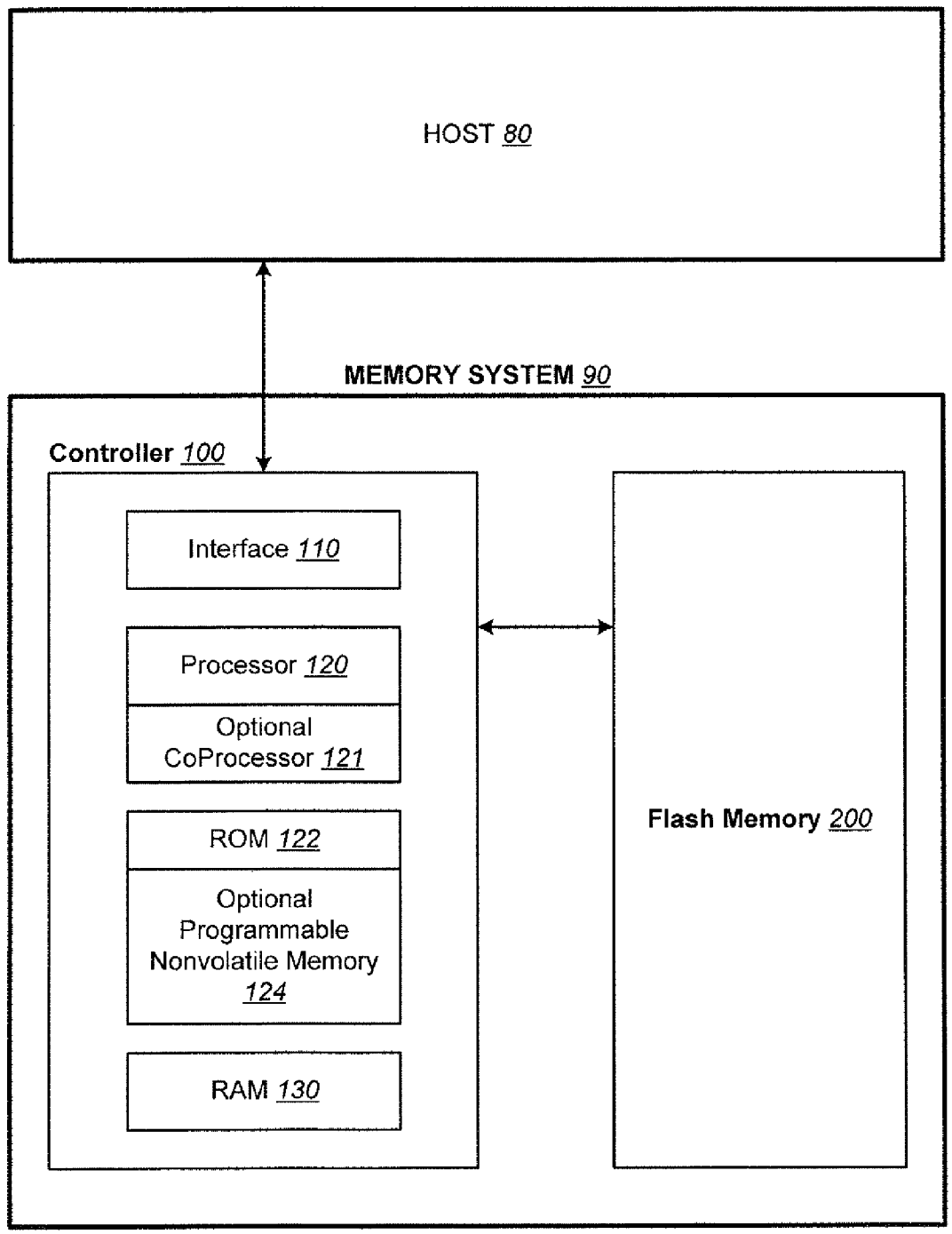
FIG. 1 shows a flash memory system connected to a host.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits, a processor, ROM (read-only-memory), RAM (random access memory), programmable nonvolatile memory, and additional components. The controller is typically formed as an ASIC (application specific integrated circuit) and the components included in such an ASIC generally depend on the particular application.

Physical Memory Structure

Figure 2:
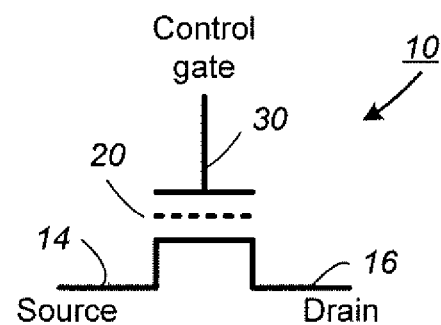
FIG. 2 illustrates a flash memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
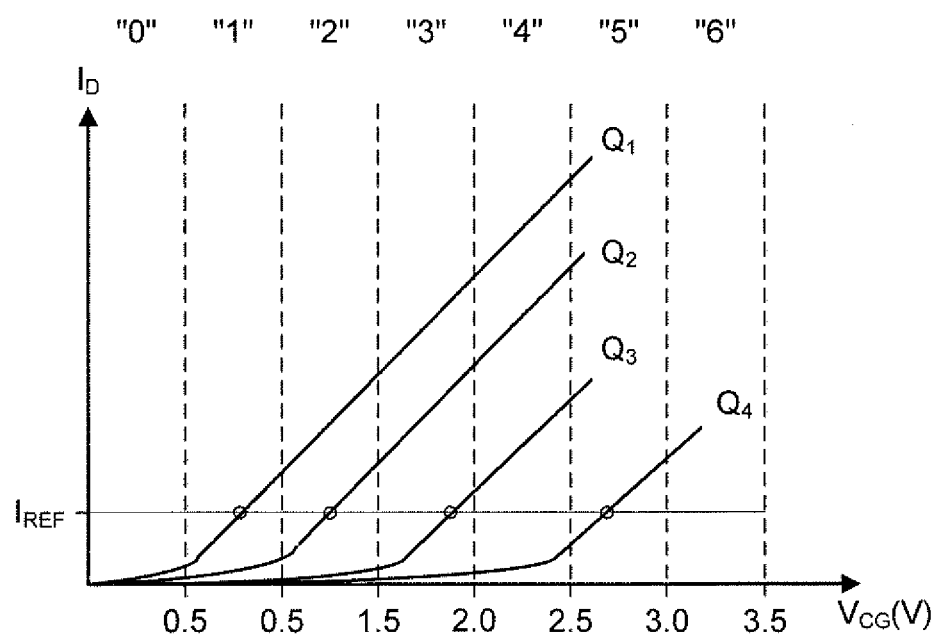
FIG. 3 illustrates charge storage in a flash memory cell.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
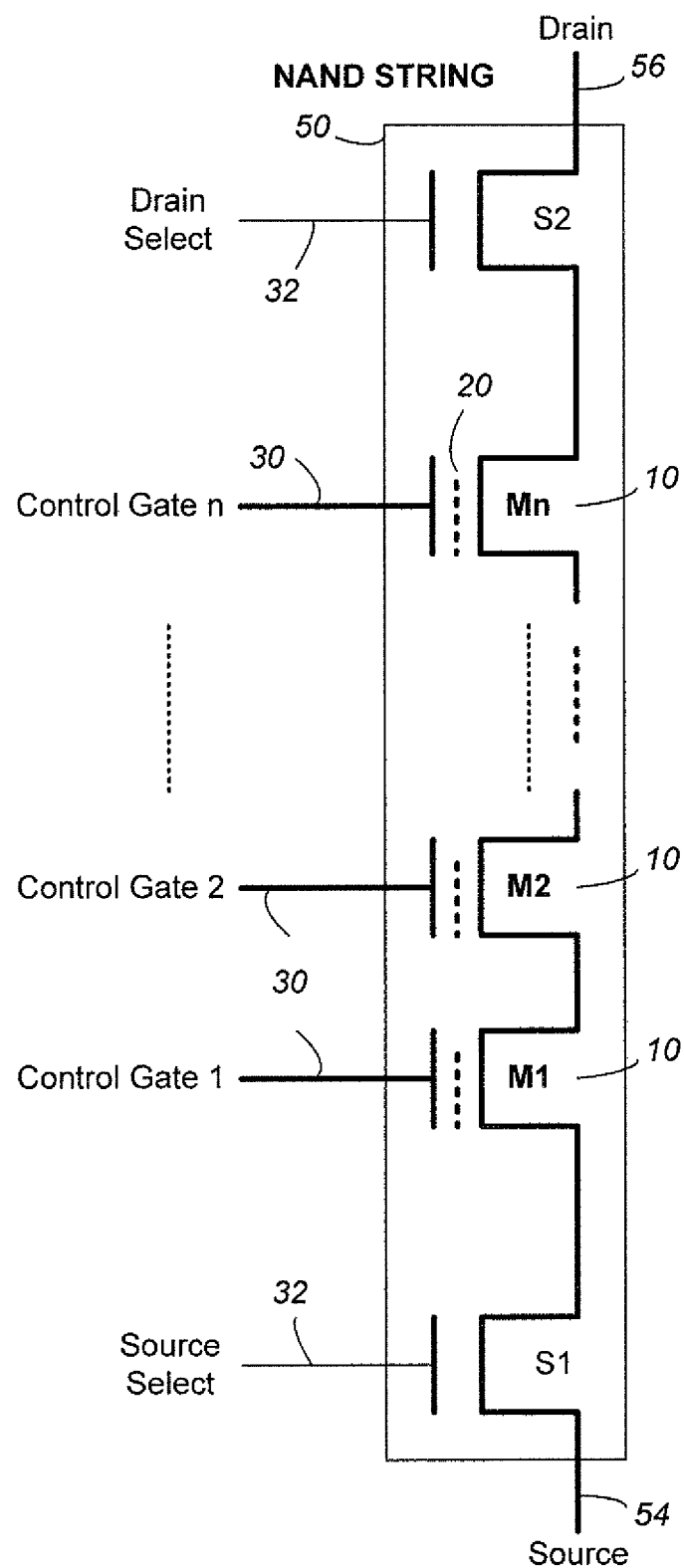
FIG. 4A shows an example of a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
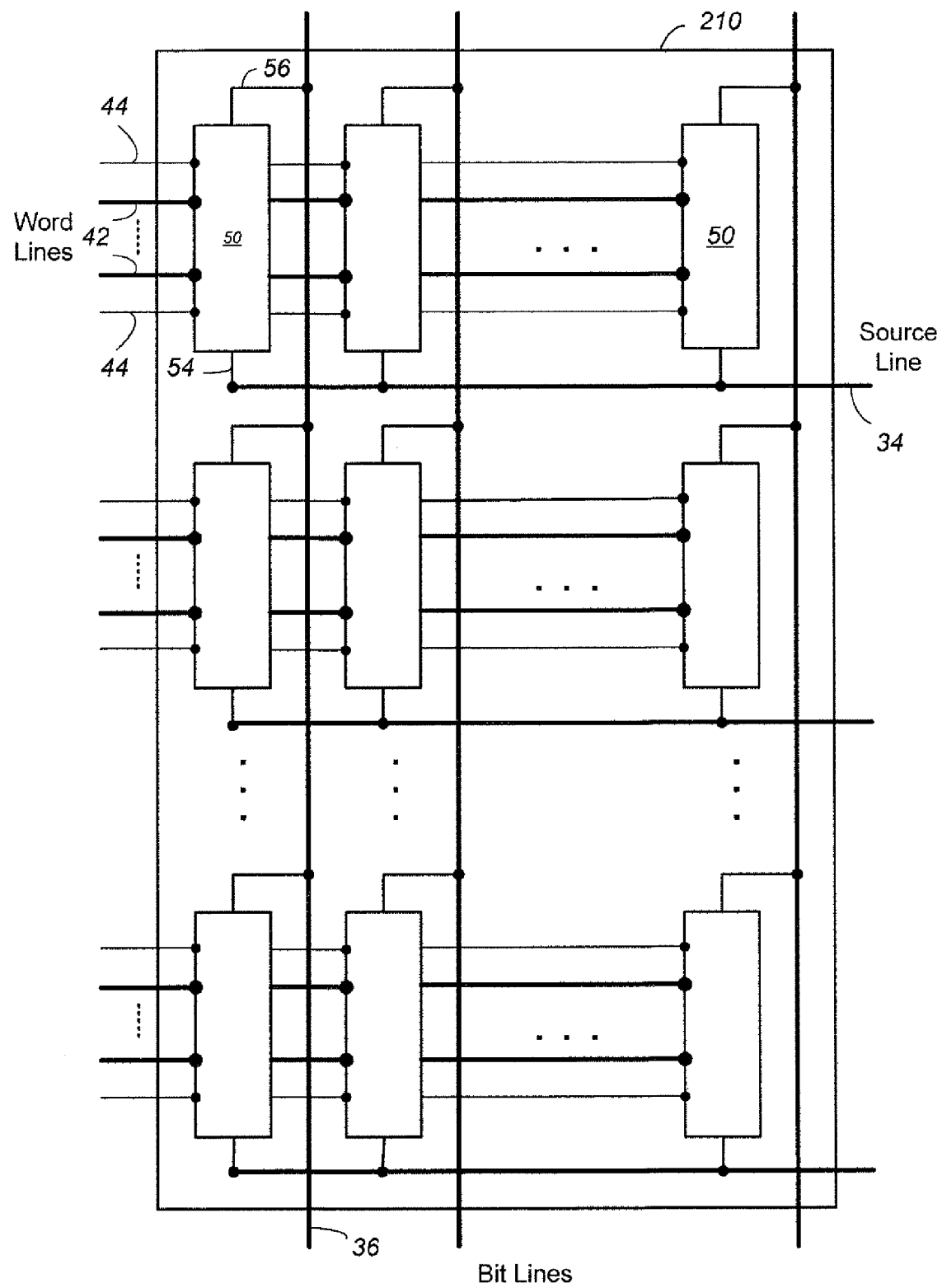
FIG. 4B shows an example of how NAND strings may be connected in a NAND flash memory array.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
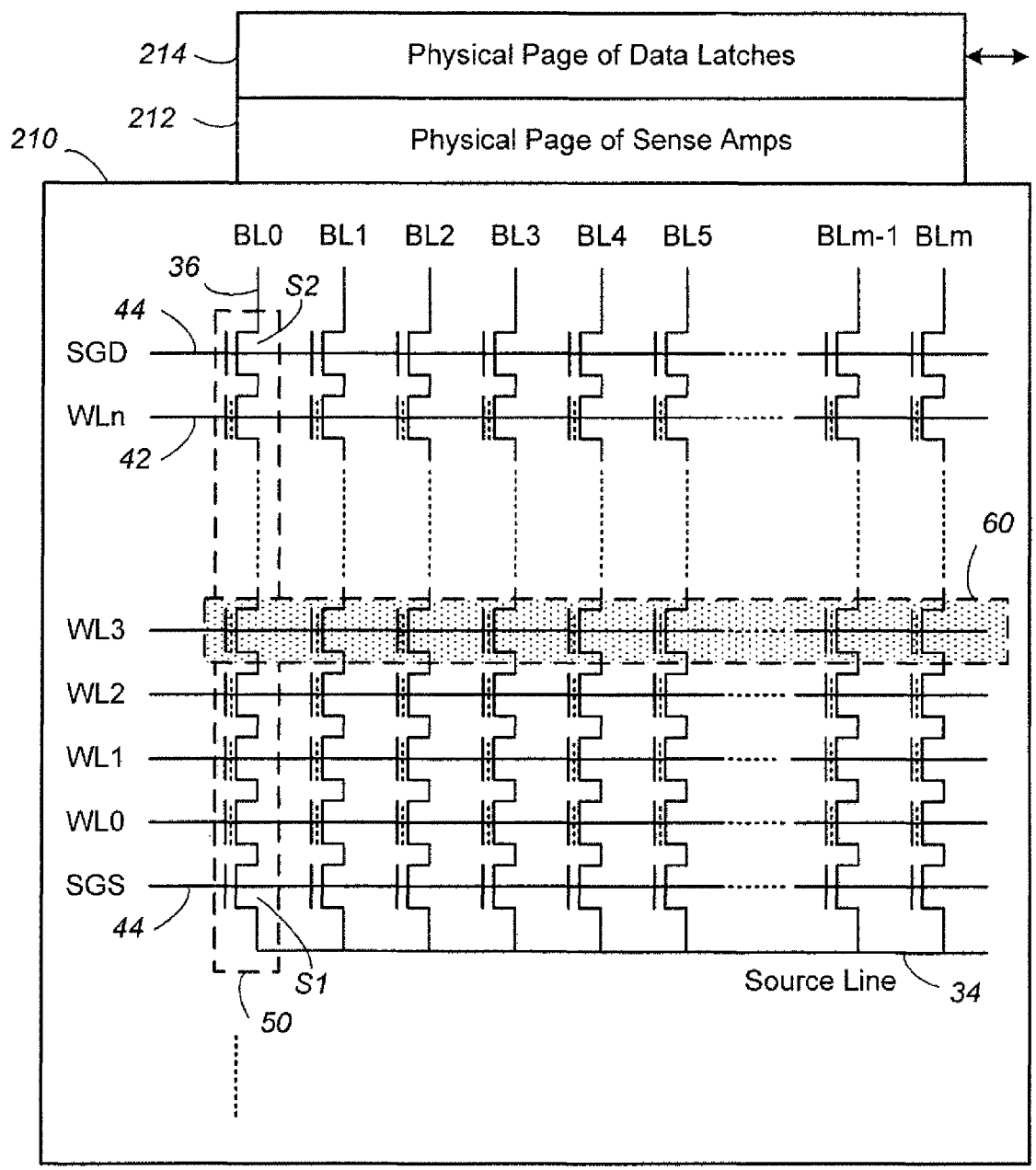
FIG. 5 shows a page of memory cells formed along a word line in a NAND flash memory array.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
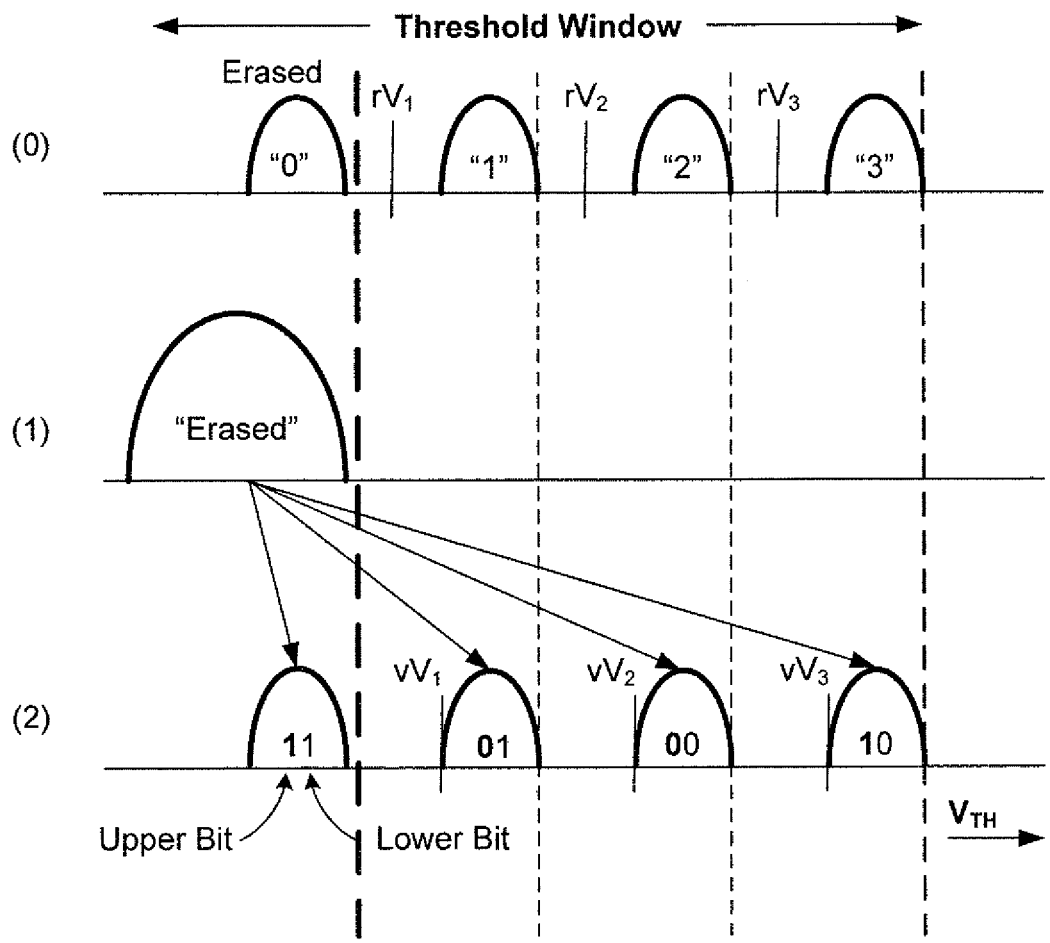
FIG. 6 illustrates programming flash memory cells.

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3" (which may also be referred to as Erase, or "E", "A", "B", and "C" states respectively). FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
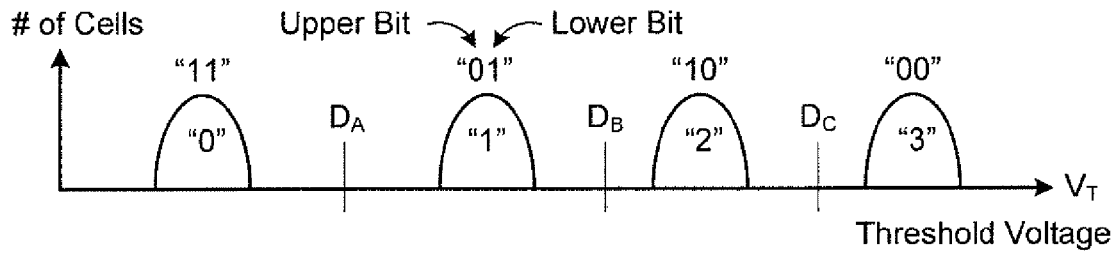
FIGS. 7A-7C illustrate programming of flash memory cells using a 2-bit code.
Figure 7B:
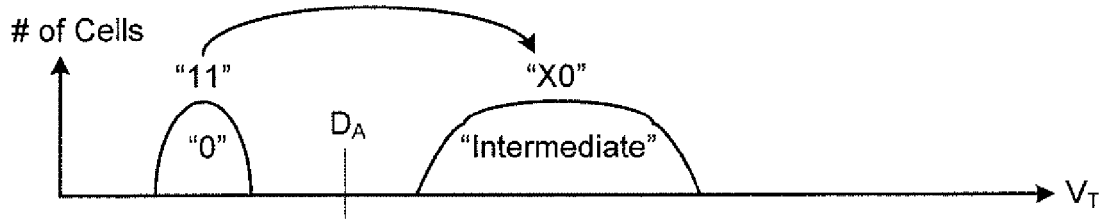
Figure 7C:
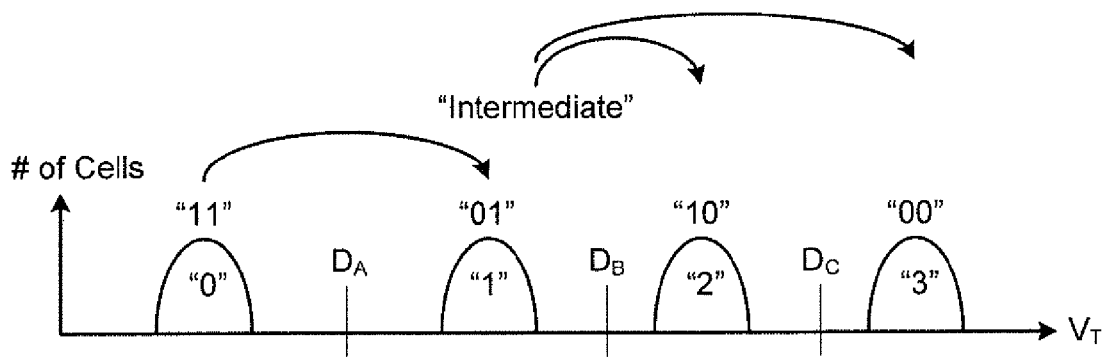

FIGS. 7A-7C illustrate the programming of a 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

FIG. 7B illustrates the lower page programming (lower bit) in a 2-pass programming scheme using the 2-bit code. The fault-tolerant programming scheme in this example essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Upper page programming may be performed in several different ways. In some cases the transition between the situations shown in FIGS. 7B and 7C involves programming all cells that need further programming at the same time. For example, cells going from "0" to "1" may be programmed in parallel with cells going from "1" to "2" or "3." If a write abort occurs during upper page programming using such a scheme, there is a high probability that cells will be in intermediate states that make it impossible to read either upper page data or lower page data from the cells. For example, cells with lower bit "1" being programmed from the "11" state to the "01" state may not be distinguishable from cells with lower page 0 being programmed from the "X0" state to "10" or "00". Thus, lower page bits cannot be resolved and the data cannot be recovered if a write abort occurs at an intermediate point. In general, conventional schemes transition cells through threshold voltage ranges in a manner that makes resolution of lower page data difficult, or impossible, at intermediate stages of upper page programming, thus making lower page data difficult or impossible to recover in the event of a write abort.

One way to secure lower page data while programming upper page data is to simply make a copy of the lower page data in another location while the upper page is being programmed. Then, the safe copy is available in case of a write abort during upper page programming. However, this approach has the clear disadvantage of the additional time and resources required to copy such data.

Certain alternative programming schemes manage the transitioning of memory cells throughout the programming of upper page, so that even if a write abort occurs when the memory cells are in some intermediate states, the lower page data can still be recovered from the cells. Such schemes move threshold voltages of memory cells so that the threshold voltages continue to reflect lower page data throughout programming of upper page data.

FIGS. 8A-C show a first protective scheme for protecting lower page data during programming of upper page data. FIG. 8A shows the same situation as shown in FIG. 7B with only lower page data stored in the page so that cells are either in the Erased state "E" or in an intermediate state. Subsequently, upper page programming occurs in two steps. In a first step, cells in the intermediate state (lower bit "0") are programmed to the two highest memory states as shown in FIG. 8B. In this illustration, these two states, previously referred to as "2" and "3" states are referred to as "B" and "C" states (with "0" and "1" states referred to as "E" and "A" states). It can be seen that, if a write abort was to occur during this step, the lower page data could still be read using a discrimination voltage $D_A$ because the threshold voltages of all cells that have lower bit "0" remain above $D_A$ (going from intermediate to B or C states) and the threshold voltages of all cells that have lower bit "1" remain below $D_A$ (remain in E state). Subsequently, only after all cells in the intermediate state have been programmed to either B or C (i.e. verified as reaching their targets) cells in the E state are programmed to the A state as shown in FIG. 8C. If a write abort occurred during this step, lower page data could be recovered using discrimination voltage $D_B$ because cells with a lower bit "0" were all programmed to a threshold voltage above $D_B$ in the first step. Thus, at every point throughout this programming scheme, it is possible to resolve between a lower bit "0" and a lower bit "1" by using an appropriate discrimination voltage. Because states B and C are programmed first (before state A) in this scheme, the scheme may be referred to as "BC First" or "BCF."

FIGS. 9A-C show a second protective scheme for protecting lower page data during programming of upper page data. FIG. 9A shows the same situation as shown in FIG. 7B with only lower page data stored in the page so that cells are either in the Erased state "E" or in an intermediate state. Subsequently, upper page programming occurs in two steps. In a first step, all cells in the intermediate state (lower bit "0") are programmed to state B (previously state "2") as shown in FIG. 9B. Thus, unlike BCF programming described above, this scheme does not program all of the cells in the intermediate state to their target levels in the first step. Instead, it programs them all to the B state, which is the target level for only some of the cells (other cells have state C as their target). This may be done relatively quickly because the B state is close to, or overlapping with, the intermediate state. Thus, memory cells do not require any large changes in threshold voltage and so programming time for this step is relatively short. This step does not depend on upper page data (i.e. all cells in intermediate cells are programmed identically whether they have an upper page "1" or "0"). If a write abort occurs during this step, lower page data can be read using discrimination voltage $D_A$. Subsequently, after all cells in the intermediate state are programmed to the B state, the upper page data is programmed as shown in FIG. 9C. Because this scheme programs lower page (lower mode) data from the intermediate state to the B state, it may be referred to as Lower Mode B, or "LMB" programming.

While both of the protective schemes described above, BCF and LMB, provide protection for lower page data during programming of upper page data, there is a penalty to be paid for programming using such schemes. In particular, because cells in the intermediate state are first moved to higher states (either to B and C, in the BCF scheme, or to B only in the LMB scheme), the potential for increased parallelism is not fully utilized. In some examples, the time to program upper page data using BCF or LMB is an additional 10%-15% as compared with conventional programming schemes which do not protect lower page data. Other protective schemes may also be used to protect lower page data, but generally at some cost in terms of the time needed to write upper page data.

It will be understood that while the present examples show MLC memories that store two bits per cell using four memory states, other MLC memories may store more bits using more memory states. Thus, there may be more than two logical pages per physical page. It will be understood that aspects of the present invention may be applied to protection of lower page data during writing of upper page data regardless of the number of logical pages stored, and that the terms "lower page" and "upper page" are not limited to a two-logical-page arrangement.

Data stored in a memory array may be considered as either committed or not committed (uncommitted). When data is initially received by a memory system it is uncommitted and a host system generally maintains a copy of such data until it receives an indication from the memory system that the data is committed. Thus, for example, a host system waits for an indication from a USB thumb drive to say that particular data is stored. If a user removes the USB thumb drive before the data is committed, the data is generally still maintained in the host system. However, once the memory system indicates that data is committed, the host may rely on the memory system and may no longer maintain a copy. Thus, once data is committed, it is important that the data is not corrupted. A memory controller may also store data in a memory array without a host write command. In this case, the data may be considered to be committed when the controller receives an indication that the data is stored. Typically, this indication is a response from the memory array to a write command that the memory controller sent. The memory controller may depend on the memory array to maintain the data after this point, and may not keep another copy in cache or RAM. Thus, data from a particular write command (from a memory controller or from a host) is typically committed after the entire write command is executed. Prior to data being committed (e.g. during programming of data of a current write command) loss of data in the memory array may not be critical because the memory controller, or the host, can resend the data. After data is committed (after completion of write command) loss of data may be critical because no other copy of the data may exist.

According to an aspect of the present invention, schemes to protect lower page data are applied selectively to protect committed lower page data, and are not applied where a lower page contains only uncommitted data. Thus, such protective schemes may be used to protect critical committed lower page data, while a conventional scheme, which is faster, is used where the lower page contains uncommitted data that can be resent by a host or controller.

FIG. 10 shows an example of an order in which pages are written in a NAND flash memory array. In the left column is the Word Line (WL) number, from 0-10. Columns marked "L" for Lower page and "U" for Upper page include entries that indicate the order in which these lower and upper pages are written. Individual entries correspond to logical pages (i.e. to units of data containing the same number of bits as the number of memory cells in a physical page of the memory array). Data may be received by the memory array in sequential order and then programmed in sequential order in the arrangement shown. Thus, for example, logical page 0 is stored in the lower page of word line 0. Then, logical page 1 is stored in the lower page of word line 1. Then, logical page 2 is stored in the upper page of word line 0. Then, logical page 3 is stored in the lower page of word line 2, and so on. Other schemes are also possible (for example, writing all lower pages first, and then writing upper pages).

FIG. 11 shows an example of data written according to an embodiment of the present invention. The data written in FIG. 11 was written in the order shown in FIG. 10. Entries in the L and U columns of FIG. 11 indicate how the data was written, using either a "normal" scheme or a BCF scheme. The term "normal" her refers to a scheme that, during programming of upper page data, transitions memory cells through states that, in the event of a write abort, do not allow recovery of lower page data (e.g. because threshold voltages of lower bit "0" and lower bit "1" cells overlap during transition). While BCF is used in this example, LMB, or other protective schemes may also be applied in a similar selective manner.

The data written in FIG. 11 corresponds to three different write commands as indicated by different shading. Thus, data of a first write command is stored in logical pages 0-3, data of a second write command is stored in logical pages 4-11, and data of a third write command is stored in logical pages 14 and higher. Data of the first write command occupies both upper and lower pages of WL 0, but only occupies lower pages of WL 1 and 2. Thus, data of the first write command may be committed before the upper pages of WL 1 and WL 2 are written. When the second write command is received, the data may be assigned to the upper page of WL 1, thus endangering committed data stored in the lower page of WL 1. Accordingly, upper page programming of this data on WL 1 uses BCF (or other protective scheme). Then, lower page data is programmed on WL 5. Then, upper page data is programmed on WL 2. Again in this case, because there is committed lower page data on WL 2, BCF is used for upper page programming on WL 2. Subsequent programming of upper page data of the second write command uses normal programming because only uncommitted lower page data (data of second write command) is placed in danger. For example, programming upper page data on WL 3 endangers lower page data on WL 3, which is uncommitted data of the second write command. All programming of lower page data is considered "normal."

At the end of the second write command, only WL 9 has lower page data but no upper page data. Thus, unlike the situation after the first write command, where both WL 1 and WL 2 had unwritten upper pages, here there is only one word line, WL 9, with a written lower page and an unwritten upper page. After the second command is fully executed, the data is committed. When a subsequent write command is received, only one logical page is to be written using the BCF scheme, because there is only one free upper page with committed data in the lower page. While the order of filling logical pages in this scheme allows either one or two upper pages to be unfilled, with committed lower pages, in other examples different filling order may result in different numbers. Selective use of protective write schemes may be applied to the appropriate number of upper pages so that any committed data stored in lower pages is protected.

FIG. 12 shows another embodiment where, in addition to using BCF, a memory cache may be used to improve write speed when a write command is received. This example uses the same write commands as shown in FIG. 11. However, in this case, when the first logical page of the second write command is written to the upper page of WL 1 using BCF, the next logical page is cached and is subsequently written to the lower page of WL 3. Thus, there is some time saving by caching the next data to be written. The next BCF write, to the upper page of WL 2, does not use cache because this is the last page that will be programmed with BCF, and there will be a transition from BCF to normal programming after this logical page. Such a transition, from BCF to normal mode, requires loading or enabling new parameters in this example, which is only possible when the die is ready (not just cache ready). Thus, caching is disabled for writing the upper page of WL 2 in preparation for the subsequent change from BCF to normal. This ensures that the ready signal sent after programming the upper page of WL 2 reflects the true ready state, and not merely the cache ready state, so that a mode change can be performed in response to this signal. After all data of the second write command is received, the third write command is received. The first logical page (logical page 13) of the third write command goes to the lower page of WL 10, the next logical page (logical page 14) goes to the upper page of WL 9 and is written using BCF. Because this is the only upper page write for this write command that endangers committed lower page data, the memory will transition from BCF to normal writing after this logical page is written. Accordingly, BCF without caching is used for this logical page in preparation for transition from BCF to normal writing. Thus, a true ready signal is returned after this logical page is written, and the transition can be perforated in response to the true ready signal.

The examples described above relate to a simple case of physical pages that each have an upper page and a lower page. In some memory systems, programming operates multiple physical pages of different planes within a die, or different dies, together. This allows a high degree of parallel operation and results in higher write speeds. Data to be stored may be interleaved between dies, and between planes within a die for increased speed. Aspects of the present invention may be applied to various designs including multi-die and multi-plane memory arrays.

FIG. 13 shows an example of operation of a multi-die arrangement that includes four dies, die 0-3, which receive three write commands shown by different shading as before. Dies may be operated so that data is interleaved between dies and pages are programmed in parallel as metapages. Each die is filled in the order shown in FIG. 10. This example is a generalization of the example of FIG. 11 to a multi-die arrangement. In this example, logical pages 0-1 are filled in all dies in response to the first write command. This data is committed. Subsequently, a second write command is received. In response to the second write command, the memory system writes data to logical page 4 of each die (the upper page of WL 2). This writing may be performed in parallel. This data is written using BCF in each die by issuing a broadcast command to enable BCF (which is later disabled). Logical page 5 corresponds to the lower page of WL 3, and is written normally. Then logical page 6 corresponds to the upper page of WL 2 and is written with BCF. After data of the second write command is committed, the third write command is received. However, as in FIG. 11, there is only one word line with an unwritten upper page and committed data in the lower page (WL 9) and so there is only one programming step using BCF.

FIG. 14 shows a similar example to that of FIG. 13, but with a boundary between write commands occurring within a metapage. In this case, the first write command fills logical page 4 (upper page of WL 1) of die 0, but does not fill logical page 4 of other dies. Thus, logical page 4 of die 0 is programmed by normal programming because when it is programmed as part of the first write command, the lower page of WL 1 contains only uncommitted data. Logical page 4 of other dies are written using BCF because when they are programmed as part of the second write command, the lower page of their WL 1s contain committed data from the first write command.

Subsequently, at the end of the first write command, logical page 13 (lower page of WL 10) of die 0 is written, while logical page 13 of other dies is unwritten. Thus, in die 0 there are two word lines with unwritten upper pages and committed data in lower pages (WLs 9 and 10). Other dies have only one such word line (WL 9). However, all dies use BCF to program logical page 16 (upper page of WL 10) because the protection is needed in die 0 and all dies are operated in parallel. While only die 0 benefits from BCF programming, using BCF for die 0 and normal programming for other dies would generally require separately loading BCF parameters and performing BCF programming, and loading normal parameters and performing normal programming. Such sequential operation would be slower than performing all programming in parallel using BCF.

FIG. 15 shows another example in which each die includes two planes and where a boundary between write commands divides a metapage within a die. As in FIG. 14, BCF is used selectively when writing data to an upper metapage where at least one plane of one die has a word line that contains committed lower page data.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of programming data in a multi-level cell (MLC) flash memory array comprising:
   prior to programming upper page data in a physical page of a memory array, determining whether lower page data stored in the physical page is committed or not committed;
   programming the upper page data in a first manner whenever the lower page data stored in the physical page is committed data; and
   programming the upper page data in a second manner whenever the lower page data stored in the physical page does not contain committed data.

2. The method of claim 1 wherein the upper page data is programmed in response to a current write command that has not completed execution, and the lower page data is identified as committed data as a result of being received and stored in response to a prior write command that completed execution prior to the current write command.

3. The method of claim 1 wherein the upper page data is programmed in response to a current write command that has not completed execution, and the lower page data is identified as not committed as a result of being received and stored in response to the current write command.

4. The method of claim 1 wherein programming in the first manner is slower than programming in the second manner.

5. The method of claim 1 wherein programming in the first manner maintains memory cells of the physical page in conditions in which lower page data is resolvable throughout the programming of the upper page data.

6. The method of claim 5 wherein programming in the second manner transitions memory cells of the physical page through intermediate conditions, and wherein lower page data is not resolvable while memory cells are in the intermediate conditions.

7. The method of claim 6 wherein the first manner programs the upper page data in two sequential steps.

8. The method of claim 7 wherein a first step of the two sequential steps programs memory cells to two memory states with two highest threshold voltage ranges and wherein a second step of the two sequential steps programs memory cells in erased state to a programmed state.

9. The method of claim 7 wherein a first step of the two sequential steps programs memory cells to only a memory state with the second highest threshold voltage range and a second step programs memory cells from the memory state with the second highest threshold voltage range to a memory state with the highest threshold voltage range and in parallel programs memory cells from erased state to a programmed state.

10. A method of selectively protecting lower page data in a multi-level cell memory array during programming of upper page data in same memory cells comprising:
   identifying data to be written in memory cells containing committed lower page data from one or more previous fully-executed write commands;
   programming the identified data using a protective upper page writing scheme that increases threshold voltages of memory cells containing the committed lower page data so that threshold voltages reflect the committed lower page data throughout the programming of the identified data; and
   programming all other upper page data using a non-protective upper page writing scheme that transitions threshold voltages of memory cells containing uncommitted lower page data through threshold voltage ranges that do not reflect the uncommitted lower page data.

11. The method of claim 10 wherein the protective upper page writing scheme is a two-step scheme and a first step only programs memory cells containing the committed lower page data to two memory states with highest threshold voltage ranges.

12. The method of claim 11 wherein a subsequent second step programs memory cells from a memory state with a lowest threshold voltage range to a memory state with a next lowest threshold voltage range.

13. The method of claim 10 wherein the protective upper page writing scheme is a two-step scheme and a first step only programs memory cells containing the committed lower page data to a memory state with a second highest threshold voltage range.

14. The method of claim 13 wherein a subsequent second step programs memory cells from the memory state with the second highest threshold voltage range to a memory state with a highest threshold voltage range and in parallel programs cells from a memory state with a lowest threshold voltage range to a memory state with the second lowest threshold voltage range.

15. The method of claim 10 further comprising selectively caching data of a subsequent page write during programming of a page of the identified data using the protective upper page writing scheme only when at least one additional page of the identified data is to be written using the protective upper page writing scheme.

16. The method of claim 10 wherein the memory array extends over a plurality of planes of memory cells and wherein data is interleaved to the plurality of planes for programming.

17. The method of claim 10 wherein the memory array extends over a plurality of dies and wherein data is interleaved to the plurality of dies for programming.

18. A multi-level cell memory with lower page protection comprising:
   a memory array that includes a plurality of physical pages of multi-level memory cells, each physical page configured to store two logical pages of data, an upper page and a lower page; and
   memory programming circuits that apply two different upper page programming schemes, a protective upper page programming scheme for physical pages containing committed lower page data and a non-protective upper page programming scheme for physical pages containing uncommitted lower page data.

19. The multi-level cell memory of claim 18 wherein the memory array comprises a plurality of memory dies.

20. The multi-level cell memory of claim 19 wherein each of the plurality of memory dies comprises a plurality of planes.

* * * * *